(12) United States Patent
Uchino

(10) Patent No.: US 6,909,270 B2
(45) Date of Patent: Jun. 21, 2005

(54) PHASE DETECTOR CAPABLE OF DETECTING AN ACCUMULATED VALUE OF PHASE DISPLACEMENT AT A HIGH SPEED AND FREQUENCY STABILITY MEASURING APPARATUS FOR ARBITRARY NOMINAL FREQUENCY USING THE SAME

(75) Inventor: Masaharu Uchino, Kanagawa (JP)

(73) Assignee: Anritsu Corporation, Kanagawa (JP)

( * ) Notice: Subject to any disclaimer, the term of this patent is extended or adjusted under 35 U.S.C. 154(b) by 2 days.

(21) Appl. No.: 10/469,224

(22) PCT Filed: Nov. 27, 2002

(86) PCT No.: PCT/JP02/12377

§ 371 (c)(1),
(2), (4) Date: Aug. 27, 2003

(87) PCT Pub. No.: WO03/046585

PCT Pub. Date: Jun. 5, 2003

(65) Prior Publication Data

US 2004/0096024 A1 May 20, 2004

(30) Foreign Application Priority Data

Nov. 28, 2001 (JP) ........................................ 2001-362504

(51) Int. Cl.[7] ........................ G01R 25/00; G01R 25/04; G06F 19/00
(52) U.S. Cl. ............................... 324/76.52; 324/76.78; 702/73
(58) Field of Search ........................... 324/76.39–76.44, 324/76.52, 76.54, 76.77–76.85, 76.53, 76.48, 76.74; 455/214; 340/658; 702/73

(56) References Cited

U.S. PATENT DOCUMENTS

| | | | | |
|---|---|---|---|---|
| 4,603,302 A | * | 7/1986 | Lawton | 329/337 |
| 5,768,291 A | * | 6/1998 | Kelton et al. | 714/746 |
| 6,310,925 B1 | * | 10/2001 | Kitta | 375/326 |
| 6,598,005 B1 | * | 7/2003 | Hillerstrom | 702/75 |

FOREIGN PATENT DOCUMENTS

| | | | |
|---|---|---|---|
| EP | 0 940 957 A1 | 9/1999 | |
| JP | 11-098432 A | 4/1999 | |
| JP | 2001-264370 | * 3/2000 | ........... G01R/23/12 |
| JP | 2001-066332 A | 3/2001 | |
| JP | 2001-264370 A | 9/2001 | |

OTHER PUBLICATIONS

M. Kihara et al; Elementary Digital Clock Technology, ISBN 4274035549; pp. 179–184; 2001.

* cited by examiner

*Primary Examiner*—Anjan Deb
*Assistant Examiner*—Jeff Natalini
(74) *Attorney, Agent, or Firm*—Frishauf, Holtz, Goodman & Chick, P.C.

(57) ABSTRACT

A phase region detector receives in-phase signal I representing in-phase component and quadrature signal Q representing quadrature component of a first signal and second signal respectively, equally divides an angle range of $2\pi$ into a plurality M of three or more of angle regions preliminarily, on virtual quadrature coordinates, sequentially assigns angle region numbers in each of the angle regions, detects the angle region corresponding to the variation of phase of the second signal starting from the phase of the first signal, and issues the angle region number assigned in this angle region. A phase displacement detector issues a signal expressing the time change of the variation of the phase from the change corresponding to the time of the angle region number. An out-of-bounds detector receives a signal issued from the phase displacement detector, and issues an out-of-bounds signal including the out-of-bounds direction every time the variation of the phase exceeds a predetermined value. A phase rotation counter issues the number of rotations of the phase by accumulating the out-of-bounds signals. A displacement accumulator determines the cumulative value of phase displacement determined by the in-phase signal I and quadrature signal Q, based on the angle region number, the number of angle regions, and the number of rotations of the phase.

45 Claims, 7 Drawing Sheets

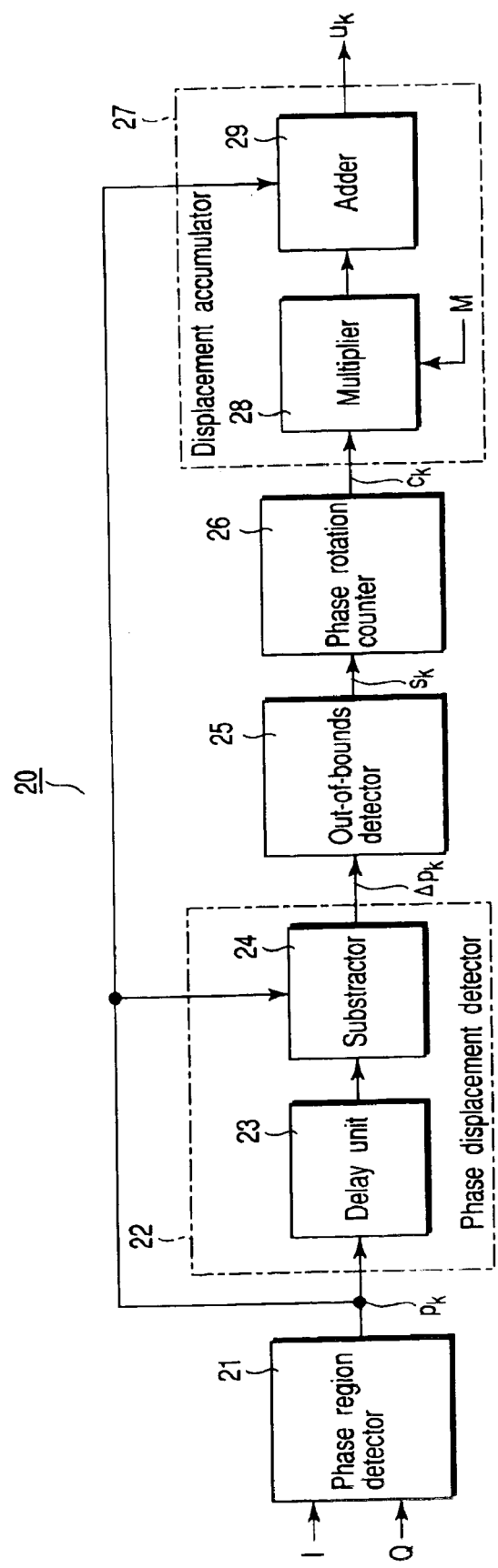
F I G. 1

| | | Range of $\Delta p_k$ | | |
|---|---|---|---|---|
| | Even | $-(M-1) \sim -((M/2)+1)$ | $-(M/2) \sim (M/2)-1$ | $(M/2) \sim M-1$ |
| Number of regions M | Even | $-(M-1) \sim -(M/2)$ | $-((M/2)-1) \sim (M/2)$ | $(M/2)+1 \sim M-1$ |
| | Odd | $-(M-1) \sim -((M/2)+1)$ | $-(M/2) \sim (M/2)$ | $(M/2)+1 \sim M-1$ |
| Output $s_k$ | | $s_k=1$ | $s_k=0$ | $s_k=-1$ |

| $I_0$ $Q_0$ | $I_1$ $Q_1$ | $I_2$ $Q_2$ | $I_3$ $Q_3$ | $I_4$ $Q_4$ | $I_5$ $Q_5$ |
|---|---|---|---|---|---|

| $p_0$ =2 | $p_1$ =8 | $p_2$ =12 | $p_3$ =14 | $p_4$ =1 | $p_5$ =6 |
|---|---|---|---|---|---|

| $\Delta p_0$ =2 | $\Delta p_1$ =6 | $\Delta p_2$ =4 | $\Delta p_3$ =2 | $\Delta p_4$ =-13 | $\Delta p_5$ =-5 |
|---|---|---|---|---|---|

| $s_0$ =0 | $s_1$ =0 | $s_2$ =0 | $s_3$ =0 | $s_4$ =1 | $s_5$ =0 |
|---|---|---|---|---|---|

| $c_0$ =0 | $c_1$ =0 | $c_2$ =0 | $c_3$ =0 | $c_4$ =1 | $c_5$ =1 |
|---|---|---|---|---|---|

| $u_0$ =2 | $u_1$ =8 | $u_2$ =12 | $u_3$ =14 | $u_4$ =17 | $u_5$ =22 |
|---|---|---|---|---|---|

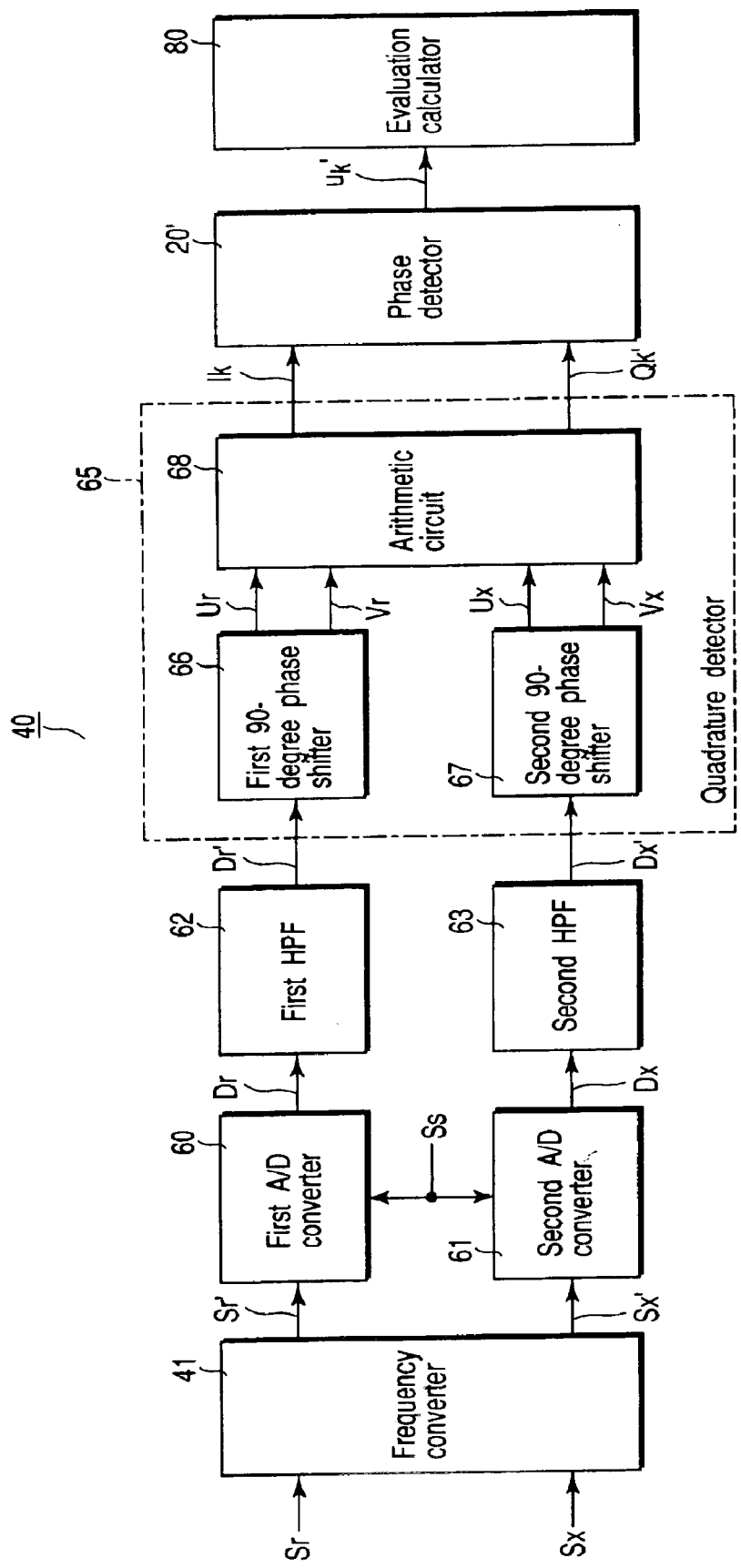
F I G. 6

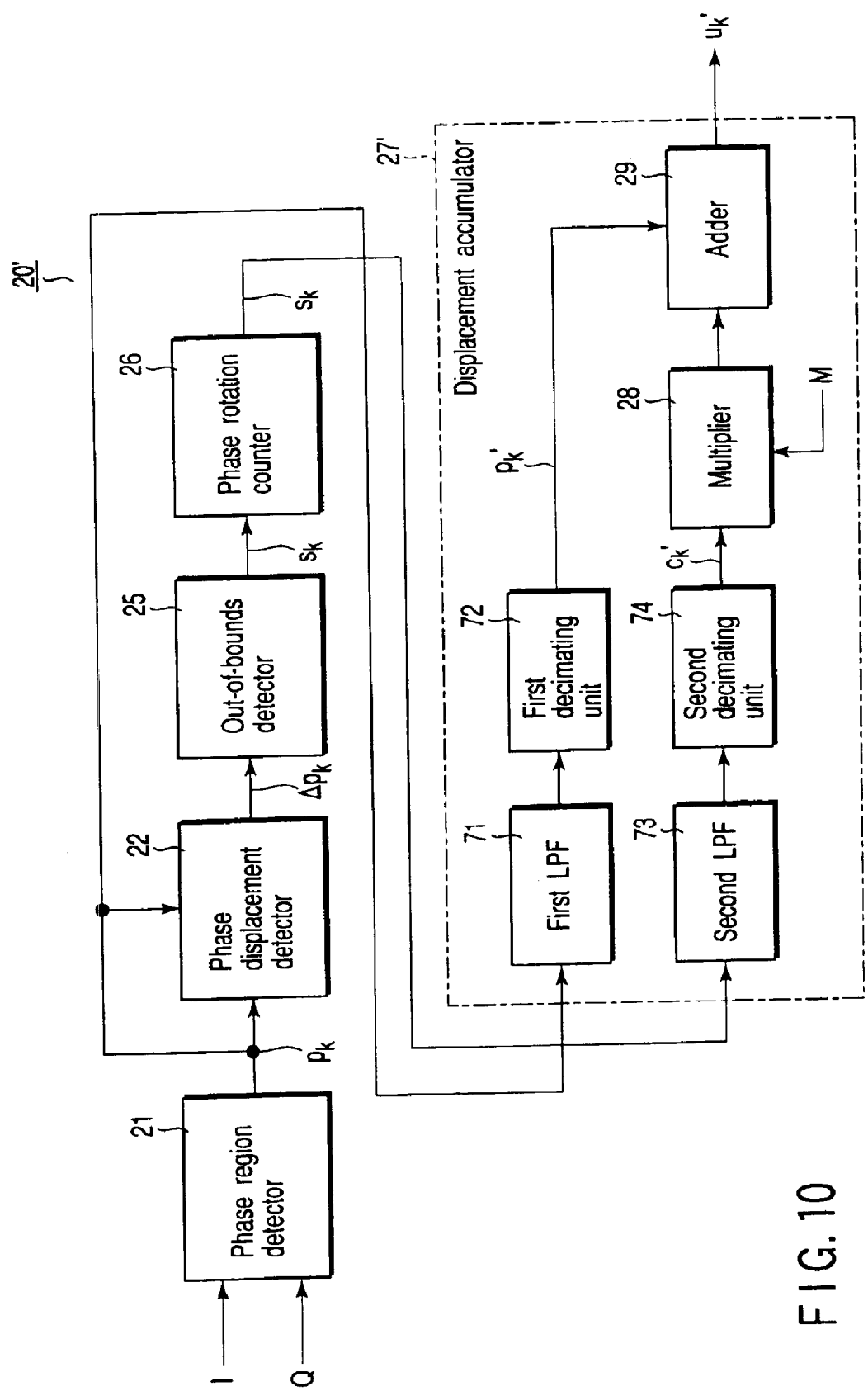
F I G. 10

PHASE DETECTOR CAPABLE OF DETECTING AN ACCUMULATED VALUE OF PHASE DISPLACEMENT AT A HIGH SPEED AND FREQUENCY STABILITY MEASURING APPARATUS FOR ARBITRARY NOMINAL FREQUENCY USING THE SAME

This application is a U.S. National Phase Application under 35 USC 371 of International Application PCT/JP02/12377 filed Nov. 27, 2002.

TECHNICAL FIELD

The present invention relates to a phase detector and a frequency stability measuring apparatus using the same, and more particularly to a phase detector employing a technology for detecting the cumulative value of phase displacement determined by in-phase signal and quadrature signal between two signals at high speed in a simple configuration, and a frequency stability measuring apparatus applicable to an arbitrary nominal frequency using the same.

BACKGROUND ART

For example, in a clock signal used in celestial observation or the like in the field of radio astronomy, only a slight fluctuation in its frequency results in a serious adverse effect on an observation result.

In such field, therefore, an atomic oscillator having an extremely high frequency stability of $10^{-13}$ or more per day (for example, $10^{-4}$ Hz or less per day in a signal of frequency of 1 GHz) is used as clock signal source.

To design and manufacture a clock signal source having such high frequency stability, it is necessary to measure the frequency stability of the signal source very precisely.

Generally, methods for measuring stability of signal frequency are known to include a method for measuring directly the frequency fluctuations of the signal to be measured by a frequency counter, and a method of measuring indirectly the frequency fluctuations of the signal to be measured by measuring the cumulative value of the phase displacement with respect to the reference signal.

This method for measuring the cumulative value of the phase displacement with respect to the reference signal is specifically described in "Elementary Digital Clock Technology" written by Masaya Kihara and Sadayasu Ono, 2001, published by Ohm-Sha (ISBN 4274035549), pp. 179 to 184.

That is, when measuring the cumulative value of phase displacement with respect to the reference signal, as shown in this publication, it is general to employ the beat system using the dual mixer and time interval counter.

In this beat system, while sharing the local oscillator, the reference signal Sr and object signal to be measured Sx are transformed into beat signal by the dual mixer, and the phase difference between the beat signals is to be measured by the time interval counter.

When detecting the phase displacement with respect to the reference signal, it is generally difficult to detect directly the phase displacement of the signals with high frequency.

Accordingly, as in this beat system, by preparing the reference signal Sr as the reference of measurement, equal in nominal frequency f to the object signal to be measured Sx and equal or higher in the frequency stability, the displacement of phase of the object signal to be measured Sx can be detected indirectly.

In such beat system, therefore, there is a problem that it is difficult to correspond to an arbitrary nominal frequency due to various reasons.

To solve this problem, a frequency stability measuring system is developed by a quadrature detection method applicable to an arbitrary nominal frequency.

That is, as shown in FIG. 11, in this frequency stability measuring system 10 by quadrature detection method, first, reference signal Sr and object signal to be measured Sx are transformed into reference signals Sr', Sx' in low frequency band by a frequency converter 1.

The reference signal Sr' and object signal to be measured Sx' transformed in the frequency converter 1 are put into a quadrature detector 2.

In the quadrature detector 2, an in-phase signal I representing an in-phase component between the entered two signals Sr', Sx', and a quadrature signal Q representing a quadrature component are determined, and put into a phase detector 3.

This phase detector 3 detects the variance $\Delta\phi$ of the phase determined by the entered in-phase signal I and quadrature signal Q, and accumulates the values of the variance $\Delta\phi$, and issues a cumulative value $\Phi$ of the phase displacement.

The cumulative value $\Phi$ of the phase displacement expresses the frequency fluctuation of the object signal to be measured Sx from the reference signal, and therefore from this cumulative value $\Phi$, it is possible to evaluate indirectly the frequency stability of the object signal to be measured Sx.

Thus, the frequency stability measuring system 10 by this quadrature detection method is applicable to any arbitrary nominal frequency, but the phase detector 3 used herein involves the following problems.

This phase detector 3 is configured specifically as shown in FIG. 12.

The phase detector 3 delays the complex number (I'+jQ') composed of in-phase signal I' and quadrature signal Q' entered at the previous clock timing by one clock period by a delay unit 4, and a conjugate complex number (I'−jQ') is determined by a conjugate converter 5.

This conjugate complex number (I'−jQ'), and a complex number (I+jQ) composed of in-phase signal I and quadrature signal Q entered at the next clock timing are multiplied at a next stage in a multiplication processor 6, and thereby II'+QQ'−j(IQ'−I'Q) is determined.

This multiplication processor 6 is actually composed of four multipliers for determining (II'), (QQ'), (IQ'), and (I'Q), and two adders for adding (or subtracting) them.

The result of multiplication process is expressed as $Ae^{j\Delta\phi}$ by using the base e of natural logarithm, phase displacement $\Delta\phi$, and positive number A, and is hence transformed into $\log A + j\Delta\phi$ by logarithmic transformation process at a next stage in a logarithmic converter 7.

Based on the calculation result in this logarithmic converter 7, the phase displacement $\Delta\phi$ of the imaginary part is extracted at a next stage by an imaginary part extractor 8.

The phase displacement $\Delta\phi$ extracted by the imaginary part extractor 8 is accumulated at a next stage by an accumulator 9.

That is, the accumulator 9 determines the cumulative value $\Phi$ corresponding to the frequency fluctuations of the object signal to be measured Sx with respect to the reference signal Sr.

In the conventional phase detector 3, however, as mentioned above, four multipliers and two adders are needed for complex multiplication process of (I+jQ) and (I'−jQ'), and the configuration is complicated, and it takes much time in arithmetic process, and high speed operation is not realized.

DISCLOSURE OF INVENTION

It is hence an object of the present invention to solve the above problems, and present a phase detector capable of detecting phase displacement at high speed in a simple configuration.

It is another object of the present invention to provide a frequency stability measuring apparatus applicable to an arbitrary nominal frequency using the same phase detector.

In this case, as the frequency stability measuring apparatus of the present invention, it is the features thereof to use a digital phase detector, instead of a conventional time interval counter.

To achieve above objects, according to the first aspect of the present invention, there is provided a phase detector for receiving in-phase signal I representing in-phase component and quadrature signal Q representing quadrature component of first signal and second signal, respectively, and determining a variation of phase of the second signal with respect to a phase of the first signal, comprising:

a phase region detector (21) which equally divides an angle range of $2\pi$ preliminarily, on virtual quadrature coordinates expressing the in-phase signal I and quadrature signal Q, into a plurality M of three or more of angle regions, sequentially assigns angle region numbers in each of the angle regions, detects the angle region corresponding to the variation of phase of the second signal starting from the phase of the first signal, and issues the angle region number assigned in the detected angle region, a phase displacement detector (22) which issues a signal expressing the time change of the variation of the phase from the change corresponding to the time of the angle region number issued from the phase region detector, an out-of-bounds detector (25) which receives a signal issued from the phase displacement detector, and issues an out-of-bounds signal including the out-of-bounds direction every time the variation amount of the phase exceeds a predetermined value on the virtual quadrature coordinates, a phase rotation counter (26) which issues the number of rotations of the phase on the virtual quadrature coordinates by accumulating the out-of-bounds signals issued from the out-of-bounds detector, and a displacement accumulator (27) which determines the cumulative value of phase displacement determined by the in-phase signal I and quadrature signal Q, based on the angle region number issued by the phase region detector, the number of angle regions, and the number of rotations of the phase issued by the phase rotation counter.

To achieve above objects, according to the second aspect of the present invention, there is provided a phase detector according to the first aspect, wherein the number M of angle regions is a numerical value expressed from about 8 bits to tens of bits.

To achieve above objects, according to the third aspect of the present invention, there is provided a phase detector according to the first aspect, wherein the phase region detector detects the angle region including the phase $\phi$ determined by the in-phase signal I and quadrature signal Q entered on the virtual quadrature coordinates, at every input timing of the in-phase signal I and quadrature signal Q, and issues angle region number $p_k$ assigned in the detected angle region.

To achieve above objects, according to the fourth aspect of the present invention, there is provided a phase detector according to the third aspect, wherein the phase region detector detects the phase angle $\phi$ determined by the in-phase signal I and quadrature signal Q by calculating the formula:

$\phi$=arg (I+jQ) (where arg(z) is a function representing argument of complex number z).

To achieve above objects, according to the fifth aspect of the present invention, there is provided a phase detector according to the third aspect, wherein the phase region detector is composed of a delay unit (23) for delaying angle region number $p_k$ issued from the phase region detector at a certain timing by one sample clock each, and a subtractor (24) for determining region number difference $\Delta p_k$ by subtracting angle region number $p_{(k-1)}$ issued from the delay unit being issued from the phase region detector at the preceding timing, from the angle region number $p_k$ issued from the phase region detector.

To achieve above objects, according to the sixth aspect of the present invention, there is provided a phase detector according to the fifth aspect, wherein the out-of-bounds detector receives a signal issued from the phase displacement detector, and issues an out-of-bounds signal including the out-of-bounds direction every time the variation amount of the phase exceeds a predetermined value on the virtual quadrature coordinates.

To achieve above objects, according to the seventh aspect of the present invention, there is provided a phase detector according to the sixth aspect, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in the plurality of angle regions.

To achieve above objects, according to the eighth aspect of the present invention, there is provided a phase detector according to the seventh aspect, wherein the out-of-bounds detector, when the number M of angle regions is an even number as the predetermined range, in the case of [M/2] being the maximum integer not exceeding M/2, issues data $s_k$=1 representing the phase is changed to exceed the bounds counterclockwise when the region number difference $\Delta p_k$ is included in the range of $-(M-1)$ to $-([M/2]+1)$, issues data $s_k$=0 representing that the phase is changed within a range not exceeding the bounds when the region number difference $\Delta p_k$ is included in the range of $-[M/2]$ to $[M/2]-1$, and issues data $s_k$=$-1$ representing that the phase is changed so as to exceed the bounds clockwise when the region number difference $\Delta p_k$ is included in the range of $[M/2]$ to $M-1$.

To achieve above objects, according to the ninth aspect of the present invention, there is provided a phase detector according to the seventh aspect, wherein the out-of-bounds detector, when the number M of angle regions is an even number as the predetermined range, in the case of [M/2] being the maximum integer not exceeding M/2, issues data $s_k$=1 representing the phase is changed to exceed the bounds counterclockwise when the region number difference $\Delta p_k$ is included in the range of $-(M-1)$ to $-[M/2]$, issues data $s_k$=0 representing that the phase is changed within a range not exceeding the bounds when the region number difference $\Delta p_k$ is included in the range of $-([M/2]-1)$ to $[M/2]$, and issues data $s_k$=$-1$ representing that the phase is changed so as to exceed the bounds clockwise when the region number difference $\Delta p_k$ is included in the range of $[M/2]+1$ to $M-1$.

To achieve above objects, according to the tenth aspect of the present invention, there is provided a phase detector according to the seventh aspect, wherein the out-of-bounds detector, when the number M of angle regions is an odd number as the predetermined range, in the case of $[M/2]$ being the maximum integer not exceeding M/2, issues data $s_k=1$ representing the phase is changed to exceed the bounds counterclockwise when the region number difference $\Delta p_k$ is included in the range of $-(M-1)$ to $-([M/2]+1)$, issues data $s_k=0$ representing that the phase is changed within a range not exceeding the bounds when the region number difference $\Delta p_k$ is included in the range of $-[M/2]$ to $[M/2]$, and issues data $s_k=-1$ representing that the phase is changed so as to exceed the bounds clockwise when the region number difference $\Delta p_k$ is included in the range of $[M/2]+1$ to $M-1$.

To achieve above objects, according to the eleventh aspect of the present invention, there is provided a phase detector according to the seventh aspect, wherein the phase rotation counter accumulates the data $s_k$ issued from the out-of-bounds detector, and determines the number of times (phase rotation count) $c_k$ of the phase rotating by $2\pi$ portion.

To achieve above objects, according to the twelfth aspect of the present invention, there is provided a phase detector according to the eleventh aspect, wherein the displacement accumulator includes a multiplier (28) and an adder (29), and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

To achieve above objects, according to the thirteenth aspect of the present invention, there is provided a frequency stability measuring apparatus comprising:

a frequency converter (41) for converting a reference signal and an object signal to be measured equal in nominal frequency into a band below a specified frequency, first and second A/D converters (60), (61) for converting the reference signal and object signal to be measured transformed by the frequency converter into digital values by sampling by a common sampling signal, first and second high pass filters (62), (63) for removing direct-current components of output signals from the first and second A/D converters, a quadrature detector (65) for detecting an in-phase signal representing its in-phase component and a quadrature signal representing its quadrature component, by detecting quadrature components of output signals from the first and second high pass filters, a phase detector (20') for detecting the variation of phase determined by the in-phase signal and quadrature signal issued from the quadrature detector, and an evaluation calculator (80) for calculating to evaluate a relative frequency stability of object signal to be measured with respect to reference signal by using the phase variation detected by the phase detector, wherein the phase detector is a phase detector for receiving in-phase signal I representing in-phase component and quadrature signal Q representing quadrature component of first signal and second signal respectively, and determining the variation of phase of the second signal with respect to the phase of the first signal, comprising:

a phase region detector (21) which equally divides an angle range of $2\pi$ preliminarily, on virtual quadrature coordinates expressing the in-phase signal I and quadrature signal Q, into a plurality M of three or more of angle regions, sequentially assigns angle region numbers in each of the angle regions, detects the angle region corresponding to the variation of phase of the second signal starting from the phase of the first signal, and issues the angle region number assigned in the detected angle region, a phase displacement detector (22) which issues a signal expressing the time change of the variation of the phase from the change corresponding to the time of the angle region number issued from the phase region detector, an out-of-bounds detector (25) which receives a signal issued from the phase displacement detector, and issues an out-of-bounds signal including the out-of-bounds direction every time the variation amount of the phase exceeds a predetermined value on the quadrature coordinates, a phase rotation counter (26) which issues the number of rotations of the phase on the quadrature coordinates by accumulating the out-of-bounds signals issued from the out-of-bounds detector, and a displacement accumulator (27) which determines the cumulative value of phase displacement determined by the in-phase signal I and quadrature signal Q, based on the angle region number issued by the phase region detector, the number of angle regions, and the number of rotations of the phase issued by the phase rotation counter.

To achieve above objects, according to the fourteenth aspect of the present invention, there is provided a frequency stability measuring apparatus according to the thirteenth aspect, wherein the frequency converter is composed by using at least one of a mixer and frequency dividing circuit.

To achieve above objects, according to the fifteenth aspect of the present invention, there is provided a frequency stability measuring apparatus according to the thirteenth aspect, wherein the first and second high pass filters are of primary CR type for processing individually by finding the average of input signals sequentially, and subtracting the obtained average from the input signal.

To achieve above objects, according to the sixteenth aspect of the present invention, there is provided a frequency stability measuring apparatus according to the thirteenth aspect, wherein the quadrature detector divides output signals Dx', Dr' issued from the first and second high pass filters into two quadrature signal components Vx, Ux and Vr, Ur respectively by first and second 90-degree phase shifters (66), (67), and issues into an arithmetic circuit, and this arithmetic circuit calculates these signal components Vx, Ux and Vr, Ur in the formula $$Ik=Vr\cdot Ur+Vx\cdot Ux$$

$$Qk=Ur\cdot Vx-Vr\cdot Ux$$

and determines the in-phase signal Ik and quadrature signal Qk.

To achieve above objects, according to the seventeenth aspect of the present invention, there is provided a frequency stability measuring apparatus according to the thirteenth aspect, wherein the number M of angle regions is a numerical value expressed from about 8 bits to tens of bits.

To achieve above objects, according to the eighteenth aspect of the present invention, there is provided a frequency stability measuring apparatus according to the thirteenth aspect, wherein the phase region detector detects the angle region including the phase $\phi$ determined by the in-phase signal I and quadrature signal Q entered on the virtual quadrature coordinates, at every input timing of the in-phase signal I and quadrature signal Q, and issues angle region number $p_k$ assigned in the detected angle region.

To achieve above objects, according to the nineteenth aspect of the present invention, there is provided a frequency stability measuring apparatus according to the eighteenth aspect, wherein the phase region detector detects the phase angle φ determined by the in-phase signal I and quadrature signal Q by calculating the formula:

φ=arg (I+jQ) (where arg(z) is a function representing argument of complex number z).

To achieve above objects, according to the twentieth aspect of the present invention, there is provided a frequency stability measuring apparatus according to the eighteenth aspect, wherein the phase region detector is composed of a delay unit (23) for delaying angle region number $p_k$ issued from the phase region detector at a certain timing by one sample clock each, and a subtractor (24) for determining region number difference $\Delta p_k$ by subtracting angle region number $p_{(k-1)}$ issued from the delay unit being issued from the phase region detector at the preceding timing, from the angle region number $p_k$ issued from the phase region detector.

To achieve above objects, according to the twenty-first aspect of the present invention, there is provided a frequency stability measuring apparatus according to the twentieth aspect, wherein the out-of-bounds detector receives a signal issued from the phase displacement detector, and issues an out-of-bounds signal including the out-of-bounds direction every time the variation of the phase exceeds a predetermined value on the virtual quadrature coordinates.

To achieve above objects, according to the twenty-second aspect of the present invention, there is provided a frequency stability measuring apparatus according to the twenty-first aspect, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in the plurality of angle regions.

To achieve above objects, according to the twenty-third aspect of the present invention, there is provided a frequency stability measuring apparatus according to the twenty-first aspect, wherein the out-of-bounds detector, when the number M of angle regions is an even number as the predetermined range, in the case of [M/2] being the maximum integer not exceeding M/2, issues data $s_k$=1 representing the phase is changed to exceed the bounds counterclockwise when the region number difference $\Delta p_k$ is included in the range of −(M−1) to −([M/2]+1), issues data $s_k$=0 representing that the phase is changed within a range not exceeding the bounds when the region number difference $\Delta p_k$ is included in the range of −[M/2] to [M/2]−1, and issues data $s_k$=−1 representing that the phase is changed so as to exceed the bounds clockwise when the region number difference $\Delta p_k$ is included in the range of [M/2] to M−1.

To achieve above objects, according to the twenty-fourth aspect of the present invention, there is provided a frequency stability measuring apparatus according to the twenty-first aspect, wherein the out-of-bounds detector, when the number M of angle regions is an even number as the predetermined range, in the case of [M/2] being the maximum integer not exceeding M/2, issues data $s_k$=1 representing the phase is changed to exceed the bounds counterclockwise when the region number difference $\Delta p_k$ is included in the range of −(M−1) to −[M/2], issues data $s_k$=0 representing that the phase is changed within a range not exceeding the bounds when the region number difference $\Delta p_k$ is included in the range of −([M/2]−1) to [M/2], and issues data $s_k$=−1 representing that the phase is changed so as to exceed the bounds clockwise when the region number difference $\Delta p_k$ is included in the range of [M/2]+1 to M−1.

To achieve above objects, according to the twenty-fifth aspect of the present invention, there is provided a frequency stability measuring apparatus according to the twenty-first aspect, wherein the out-of-bounds detector, when the number M of angle regions is an odd number as the predetermined range, in the case of [M/2] being the maximum integer not exceeding M/2, issues data $s_k$=1 representing the phase is changed to exceed the bounds counterclockwise when the region number difference $\Delta p_k$ is included in the range of −(M−1) to −([M/2]+1), issues data $s_k$=0 representing that the phase is changed within a range not exceeding the bounds when the region number difference $\Delta p_k$ is included in the range of −[M/2] to [M/2], and issues data $s_k$=−1 representing that the phase is changed so as to exceed the bounds clockwise when the region number difference $\Delta p_k$ is included in the range of [M/2]+1 to M−1.

To achieve above objects, according to the twenty-sixth aspect of the present invention, there is provided a frequency stability measuring apparatus according to the twenty-first aspect, wherein the phase rotation counter accumulates the data $s_k$ issued from the out-of-bounds detector, and determines the number of times (phase rotation count) $c_k$ of the phase rotating by 2 π portion.

To achieve above objects, according to the twenty-seventh aspect of the present invention, there is provided a frequency stability measuring apparatus according to the eighteenth aspect, wherein the displacement accumulator includes a multiplier (28) and an adder (29), and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

To achieve above objects, according to the twenty-eighth aspect of the present invention, there is provided a frequency stability measuring apparatus according to the twenty-seventh aspect, wherein the displacement accumulator is composed of first and second low pass filters (71), (73) for treble cut-off process of the angle region number $p_k$ and number of rotations $c_k$ of phase, first and second decimating units (72), (74) for decimating by L/1 the outputs from the first and second low pass filters, a multiplier (28) for multiplying the processing result $c_k'$ in the second decimating unit and the number M of angle regions, and an adder (29) for summing up the output from the multiplier and the processing result $p_k'$ in the first decimating unit, and thereby the decimated phase displacement $u_k'$ is issued from the adder into the evaluation calculator.

The phase detector and the frequency stability measuring apparatus using the same according to the present invention can be applied in analysis in a wide range, not limited to the frequency stability of an atomic oscillator of arbitrary nominal frequency as mentioned above, but also including the quality of a clock signal of digital device operating at high speed (various indices defining noise components such as jitter, wonder, and two-sample variance).

BRIEF DESCRIPTION OF THE DRAWINGS

FIG. 1 is a block diagram showing a configuration of a phase detector applied as a first embodiment of the present invention;

FIG. 6 is a block diagram showing a configuration of a frequency stability measuring apparatus applied as a second embodiment of the present invention;

FIG. 10 is a block diagram showing a configuration of a phase detector applied in the frequency stability measuring apparatus in FIG. 6;

BEST MODE FOR CARRYING OUT THE INVENTION

Figures 2, 3:
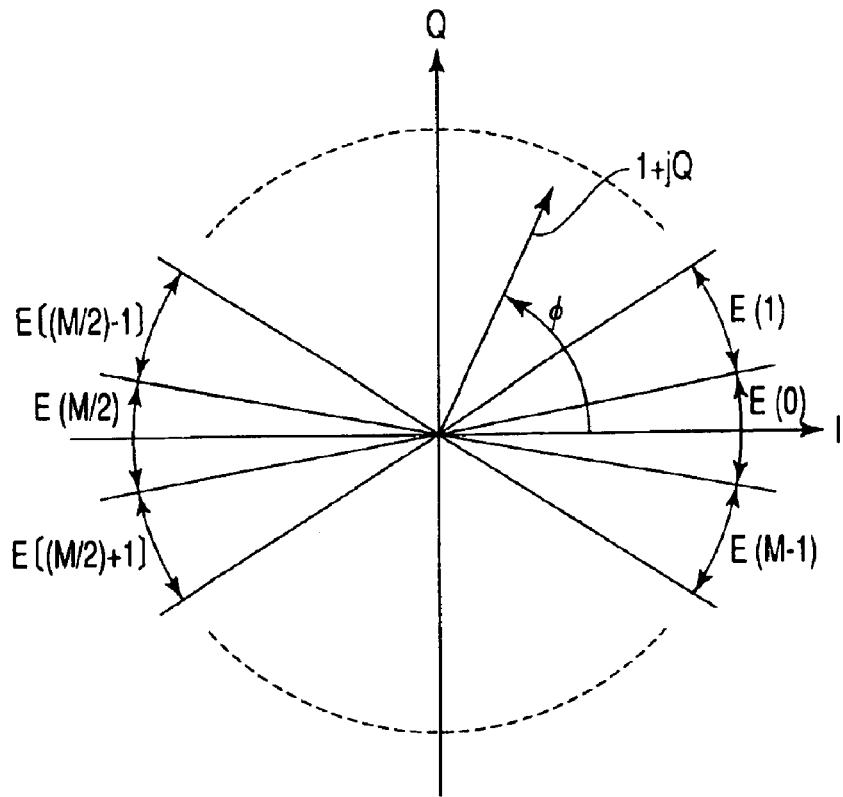
FIG. 2 is a diagram explaining the operation of essential parts of the phase detector in FIG. 1.
FIG. 3 is a diagram explaining the operation of essential parts of the phase detector in FIG. 1.

Preferred embodiments of phase detector and frequency stability measuring apparatus using the same of the present invention will be described below referring to the accompanying drawings.

First Embodiment

Referring first to FIG. 1 to FIG. 4F, the phase detector applied as a first embodiment of the present invention is described below.

FIG. 1 is a block diagram showing a configuration of a phase detector 20 applied as the first embodiment of the present invention.

This phase detector 20 receives in-phase signal I showing in-phase component and quadrature signal Q showing quadrature component of a first signal and second signal respectively entered at every timing of sampling by way of an A/D converter of sampling clock type not shown, and determines the variation of phase of the second signal with respect to the phase of the first signal.

That is, the phase detector 20 sequentially receives the in-phase signal O showing the in-phase component and the quadrature signal Q showing the quadrature component between two signals, and determines the displacement of phase determined by the in-phase signal I and quadrature signal Q.

The phase detector 20 has, as described below, a phase region detector 21 which sequentially assigns angle region numbers to a plurality M of three or more of angle regions obtained by equally dividing an angle range of 2 π preliminarily, on virtual quadrature coordinates expressing the in-phase signal I and quadrature signal Q, detects the angle region including the phase determined by the entered in-phase signal I and quadrature signal Q upon every input of the in-phase signal I and quadrature signal Q, and issues the angle region number of the detected angle region at every timing of each sampling clock.

That is, this phase region detector 21 equally divides the angle range of 2 π into a plurality M of three or more of angle regions preliminarily on virtual quadrature coordinates expressing the in-phase signal I and quadrature signal Q, and assigns the angle region numbers sequentially in every angle region, and therefore it detects the angle region corresponding to the variation of the phase of the second signal starting from the phase of the first signal, and issues the angle region number assigned in the detected angle region.

The phase detector 20 also has a phase displacement detector 22 which determines the difference between the angle region number issued by the phase region detector 21 at the timing of a certain sampling clock and the angle region number issued at the timing of its preceding sampling clock, sequentially as information expressing the displacement amount and displacement direction of the phase.

That is, this phase displacement detector 22 issues a signal showing the time change of the variation amount of the phase from the change to the time of the angle region number issued from the phase region detector 21.

The phase detector 20 further has an out-of-bounds detector 25 which inspects whether or not the region number difference issued by the phase displacement detector 22 is within a predetermined range about the number M of the angle region, and issues data showing whether or not the phase is displaced to exceed the bounds of the angle region corresponding to the initial value of the region number assigned in the plurality of angle regions and the angle region corresponding to the final value.

That is, this out-of-bounds detector 25 receives the signal issued from the phase displacement detector 22, and issues an out-of-bounds signal including the out-of-bounds direction every time the variation amount of the phase exceeds a predetermined value on the virtual quadrature coordinates.

The phase detector 20 moreover has a phase rotation counter 26 which determines the number of rotations of the phase by accumulating the data issued by the out-of-bounds detector 26.

That is, this phase rotation counter 26 issues the number of rotations of the phase on the virtual quadrature coordinates by accumulating the out-of-bounds signals issued from the out-of-bounds detector 25.

The phase detector 20 still has a displacement accumulator 27 which determines the cumulative value of phase displacement determined by the in-phase signal I and quadrature signal Q, based on the region number issued by the phase region detector 21, the number M of angle regions, and the phase rotation count issued by the phase rotation counter 26.

That is, this displacement accumulator 27 determines the cumulative value of phase displacement determined by the in-phase signal I and quadrature signal Q, based on the angle region number issued by the phase region detector 21, the number of angle regions, and the number of rotations of the phase issued by the phase rotation counter 26.

The phase region detector 21 in the phase detector 20 having such configuration operates as shown in FIG. 2, by sequentially assigning angle region numbers 0, 1, ..., M−1 to a plurality M (in FIG. 2, M is an even number) of angle regions E(0), E(1), E(M−1) obtained by equally dividing an angle range of absolute value of 2 π (that is, +2 π or −2 π or from +π to −π) preliminarily, on virtual quadrature coordinates of I-axis and Q-axis mutually expressing the in-phase signal I and quadrature signal Q.

Further, the phase region detector 21 detects the angle region including the phase φ determined by the in-phase signal I and quadrature signal Q entered on the virtual quadrature coordinates, at every timing of the sampling clock of input of the in-phase signal I and quadrature signal Q, and issues the angle region number $p_k$ assigned in the detected angle region.

The phase angle φ determined by the in-phase signal I and quadrature signal Q is calculated in the following formula:

$$\phi = arg(I+jQ),$$

where arg(z) is a function expressing the argument of complex number z.

In this case, the number M of angle regions is the value for determining the precision of phase displacement precision, and the greater the number M of angle regions, the higher is the precision of phase displacement detection.

The number M of angle region is 3 or more, and actually it is a numerical value expressed, for example, from about 8 bits to tens of bits.

The angle region number $p_k$ thus obtained in the phase region detector 21 is put into the phase displacement detector 22.

The phase displacement detector 22 is composed of a delay unit 23 for delaying the angle region number $p_k$ issued from the phase region detector 21 by one sample (clock) each, and a subtractor 24 for determining the region number difference $\Delta p_k$ by subtracting the angle region number p(k−1) issued from the delay unit 23 issued at the timing of a previous sampling clock, from the angle region number $p_k$ issued from the phase region detector 21.

The phase displacement detector 22 determines this region number difference $\Delta p_k$ sequentially as the information expressing the displacement amount and displacement direction of the phase, and sends out to the out-of-bounds detector 25.

The out-of-bounds detector 25 inspects the region number difference $\Delta p_k$ issued from the phase displacement region 22 to identify with any one of three ranges predetermined as shown in FIG. 3 about the number M of angle regions mentioned above.

Consequently, the out-of-bounds detector 25 issues data $s_k$ showing whether the phase is changed or not so as to exceed the bounds of the angle region E(0) corresponding to the initial value 0 and the angle region E(M−1) corresponding to the final value M−1 of the angle region numbers assigned in the plurality M of angle regions E(0), E(1), ..., E(M−1).

That is, the out-of-bounds detector 25 receives a signal issued from the phase displacement detector 22, and issues an out-of-bounds signal $s_k$ including the out-of-bounds direction every time the variation amount of the phase crosses the predetermined value on the virtual quadrature coordinates.

As shown in FIG. 3, there are two methods of setting the predetermined range in the case of an even number M of angle regions.

In a first range setting example (top in FIG. 3), the out-of-bounds detector 25 issues data $s_k$=1 showing the phase is changed to exceed the bounds counterclockwise when the region number difference $\Delta p_k$ is included in the range of −(M−1) to −([M/2]+1), with [M/2] being the maximum integer not exceeding M/2.

In this case, if the region number difference $\Delta p_k$ is included in the range of −[M/2] to [M/2]−1, the out-of-bounds detector 25 issues data $s_k$=0 showing that the phase is changed within a range not exceeding the bounds.

Or, in this case, if the region number difference $\Delta p_k$ is included in the range of [M/2] to M−1, the out-of-bounds detector 25 issues data $s_k$=−1 showing that the phase is changed so as to exceed the bounds clockwise.

In a second range setting example in the case of an even number M of angle region (middle in FIG. 3), the out-of-bounds detector 25 issues data $s_k$=1 showing the phase is changed to exceed the bounds counterclockwise when the region number difference $\Delta p_k$ is included in the range of −(M−1) to −[M/2].

In this case, if the region number difference $\Delta p_k$ is included in the range of −([M/2]−1) to [M/2], the out-of-bounds detector 25 issues data $s_k$=0 showing that the phase is changed within a range not exceeding the bounds.

Or, in this case, if the region number difference $\Delta p_k$ is included in the range of [M/2]+1 to M−1, the out-of-bounds detector 25 issues data $s_k$=−1 showing that the phase is changed so as to exceed the bounds clockwise.

As the predetermined range about the number M of angle regions, when the number M of angel regions is an odd number (bottom in FIG. 3), with [M/2] being the maximum integer not exceeding M/2, the out-of-bounds detector 25 issues data $s_k$=1 showing the phase is changed to exceed the bounds counterclockwise when the region number difference $\Delta p_k$ is included in the range of −(M−1) to −([M/2]+1).

In this case, if the region number difference $\Delta p_k$ is included in the range of −[M/2] to [M/2], the out-of-bounds detector 25 issues data $s_k$=0 showing that the phase is changed within a range not exceeding the bounds.

Further, in this case, if the region number difference $\Delta p_k$ is included in the range of [M/2]+1 to M−1, the out-of-bounds detector 25 issues data $s_k$=−1 showing that the phase is changed so as to exceed the bounds clockwise.

The phase rotation counter 26 accumulates the data $s_k$ issued from the out-of-bounds detector 25, and determines the number of times (phase rotation count) $c_k$ of the phase rotating by 2 π portion.

The displacement accumulator 27 including a multiplier 28 and an adder 29 multiplies the phase rotation count $c_k$ issued from the phase rotation counter 26 and the number M of angle regions by the multiplier 28, and sums up the result of multiplication and the angle region number $p_k$ issued from the phase region detector 21 by the adder 29, and determines the cumulative value $u_k$ of the phase displacement determined by the in-phase signal I and quadrature signal Q.

The operation of the phase detector 20 having such configuration will be explained.

In the following explanation, for the sake of ease understanding of operation, the number M of angle regions is supposed to be 16.

Figures 4A, 4B, 4C, 4D, 4E, 4F, 5:
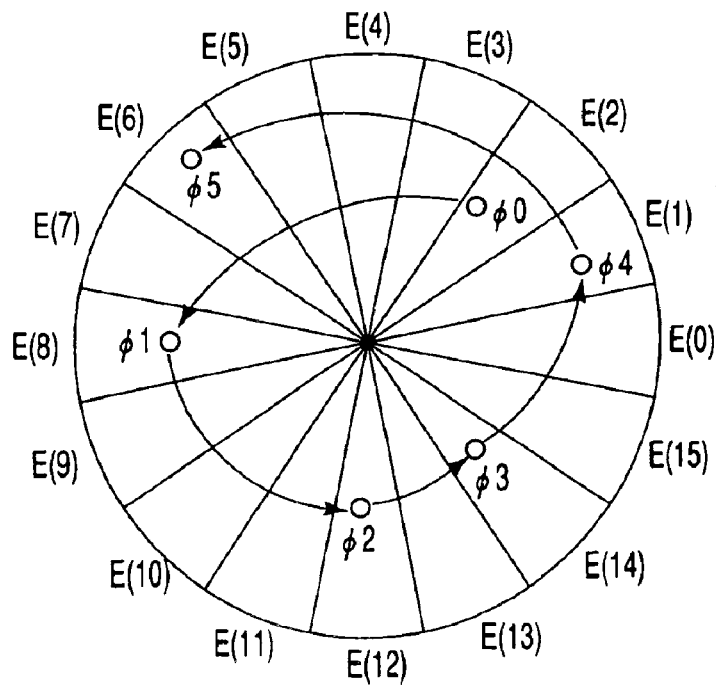
FIGS. 4A to 4F are diagrams explaining the operation of the essential parts of the phase detector in FIG. 1.
FIG. 5 is a diagram explaining the operation of the phase detector in FIG. 1.

In this phase detector 20, as shown in FIG. 4A, when sets of in-phase signal I and quadrature signal Q ($I_0, Q_0$), ($I_1, Q_1$), ($I_2, Q_2$), ... are sequentially entered at every timing of sampling clock by way of, for example, A/D converter or the like of sampling type not shown, the phase region detector 21 determines phases φ0, φ1, φ2, ... determined by these sets of in-phase signal I and quadrature signal Q.

The phase region detector 21 identifies these phases φ0, φ1, φ2, ... with any one of 16 angle regions E(0), E(1), . . . , E(15) obtained by 16 equal divisions of $2\pi$ as shown in FIG. 5, and issues angle region numbers $p_0$, $p_1$, $p_2$, . . . corresponding to each angle region as shown in FIG. 4B.

Herein, if the phases $\phi 0$, $\phi 1$, $\phi 2$, . . . are displaced counterclockwise from angle region E(2) to angle region E(8), angle region E(12), angle region E(14), angle region E(1), and angle region E(6), in this sequence as shown in FIG. 5, the angle region numbers issued from the phase region detector 21 are $p_0=2$, $p_1=8$, $p_2=12$, $p_3=14$, $p_4=1$, $p_5=6$, . . . as shown in FIG. 4B.

In this case, the phase displacement detector 22 detects the region number difference $\Delta p_k$ sequentially as follows as shown in FIG. 4C, and issues to the out-of-bounds detector 25.

$$\Delta p_0 = P_0 - 0 = 2$$

$$\Delta p_1 = P_1 - P_0 = 6$$

$$\Delta p_2 = P_2 - P_0 = 6$$

$$\Delta p_2 = P_2 - P_1 = 4$$

$$\Delta p_4 = P_4 - P_3 = -13$$

$$\Delta p_5 = P_5 - P_3 = 5$$

The out-of-bounds detector 25, in this embodiment, detects whether or not the phase has exceeded the bounds, by using the first range setting example when the number M of angle regions is an even number.

Also, the out-of-bounds detector 25, when receiving a region number difference $\Delta p_k$ of –8 or more to 7 or less from the phase displacement detector 22, such as region number difference $\Delta p_0$, $\Delta p_1$, $\Delta p_2$, $\Delta p_3$, or $\Delta p_5$, issues detection data of 0 such as $s_0$, $s_1$, $s_2$, $s_3$, $s_5$, . . . as shown in FIG. 4D.

Further, the out-of-bounds detector 25, when receiving a region number difference $\Delta p_k$ of –9 or less from the phase displacement detector 22 such as region number difference $\Delta p4$, issues data $s_4$ of "1" showing the phase is changed to exceed counterclockwise the bounds of the angle region E(0) corresponding to the first region number 0 and the angle region E(15) corresponding to the final region number 15.

Although not shown, the out-of-bounds detector 25, when receiving an angle region number difference $\Delta p_k$ of 8 or more from the phase displacement detector 22, issues data $s_k$ of "–1" showing the phase is changed to exceed clockwise the bounds of the angle regions E(0), E(15).

The phase rotation counter 26 accumulates the data $s_k$ issued from this out-of-bounds detector 25, and issues the number of rotations $c_k$ of the phase as follows sequentially as shown in FIG. 4E.

$$c_0 = 0$$

$$c_1 = 0$$

$$c_2 = 0$$

$$c_3 = 0$$

$$c_4 = 1$$

$$c_5 = 1$$

The number of rotations $c_k$ of the phase is input into the displacement accumulator 27 together with the angle region number $p_k$ issued from the phase region detector 21, and is calculated sequentially as follows, and the cumulative values $u_0$, $u_1$, $u_2$, . . . of the phase displacement are issued as shown in FIG. 4F.

$$u_0 = P_0 + C_0 M = P_0 = 2$$

$$u_1 = P_1 + C_1 M = P_1 = 8$$

$$u_2 = P_2 + C_2 M = P_2 = 12$$

$$u_3 = P_3 + C_3 M = P_3 = 14$$

$$u_4 = P_4 + C_4 M = P_4 + M = 1 + 16 = 17$$

$$u_5 = P_5 + C_5 M = P_5 + M = 6 + 16 = 22$$

Thus, the phase detector 20 of the embodiment, first, identifies the phase determined by the in-phase signal I and quadrature signal Q entered at the timing of a certain sampling clock with any one of three or more plurality M of angle regions E(0), E(1), . . . , E(M–1) obtained by equally dividing the angle range of $2\pi$ preliminarily, on virtual quadrature coordinates expressing the in-phase signal I and quadrature signal Q, and detects the angle region number assigned in this angle region.

Next, the phase detector 20 determines the difference $\Delta p_k$ of the detected angle region number and the angle region number detected at the timing of the preceding sampling clock, and inspects whether or not the region number difference $\Delta p_k$ is within the predetermined range about the number of regions M.

Herein, as the range predetermined about the number M of angle regions, the phase detector 20 determines the out-of-bounds data showing whether or not the phase is displaced over the bounds of the first angle region E(0) and final angle region E(M–1).

Accordingly, the phase detector 20 determines the cumulative value $u_k$ of the phase displacement by calculation based on the number of rotations $c_k$ obtained by accumulating the out-of-bounds data, the angle region number $p_k$, and the number M of angle regions.

Therefore, the phase detector 20 of the embodiment, as compared with the conventional method for determining the phase displacement by multiplication process of complex number of two sets of in-phase signal I and quadrature signal Q entered continuously, is smaller in the quantity of arithmetic process and is higher in operation speed.

Second Embodiment

As a second embodiment of the present invention, this is to explain a frequency stability measuring apparatus for measuring the frequency stability of the object signal to be measured with respect to the reference signal, by using the phase detector having the above configuration.

FIG. 6 shows a configuration of a frequency stability measuring apparatus 40 applied as the second embodiment of the present invention.

In FIG. 6, a frequency converter 41 transforms reference a signal Sr and an object signal to be measured Sx equal in nominal frequency fa into a band below a specified frequency.

Figure 7:
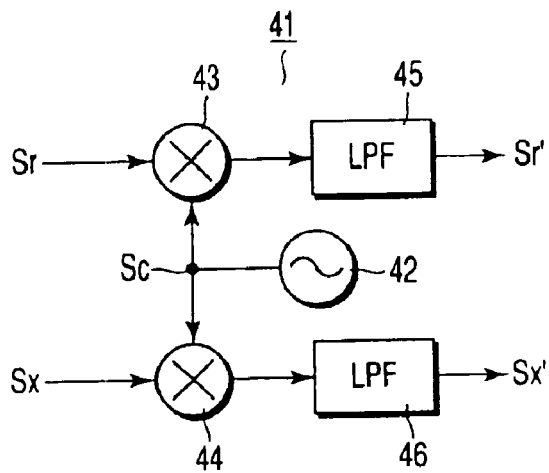
FIG. 7 is a diagram showing a configuration example of essential parts of the frequency stability measuring apparatus in FIG. 6.
Figure 8:
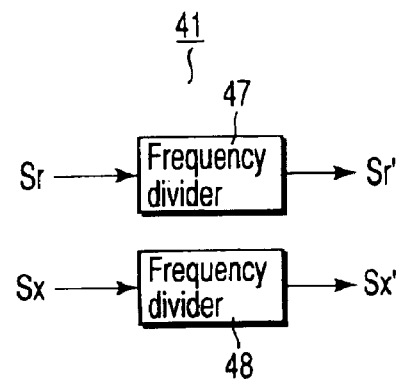
FIG. 8 is a diagram showing a configuration example of essential parts of the frequency stability measuring apparatus in FIG. 6.
Figure 9:
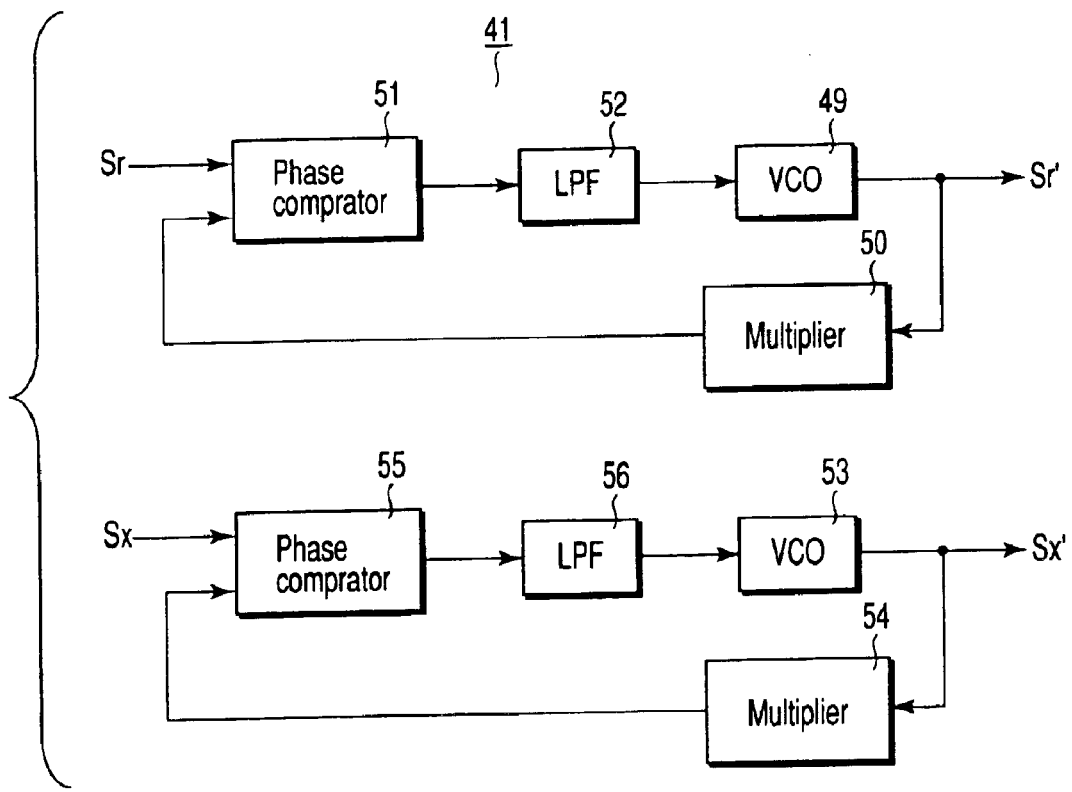
FIG. 9 is a diagram showing a configuration example of essential parts of the frequency stability measuring apparatus in FIG. 6.
Figure 11:
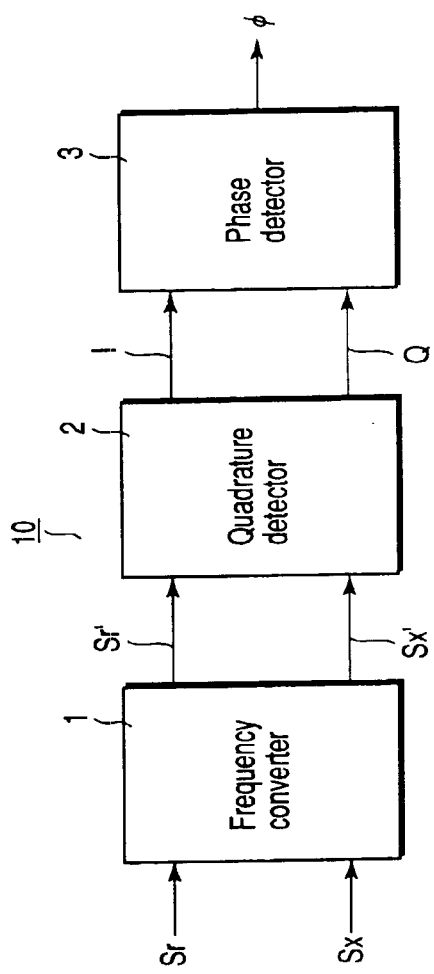
FIG. 11 is a block diagram showing a configuration of a frequency stability measuring system in a prior art.
Figure 12:
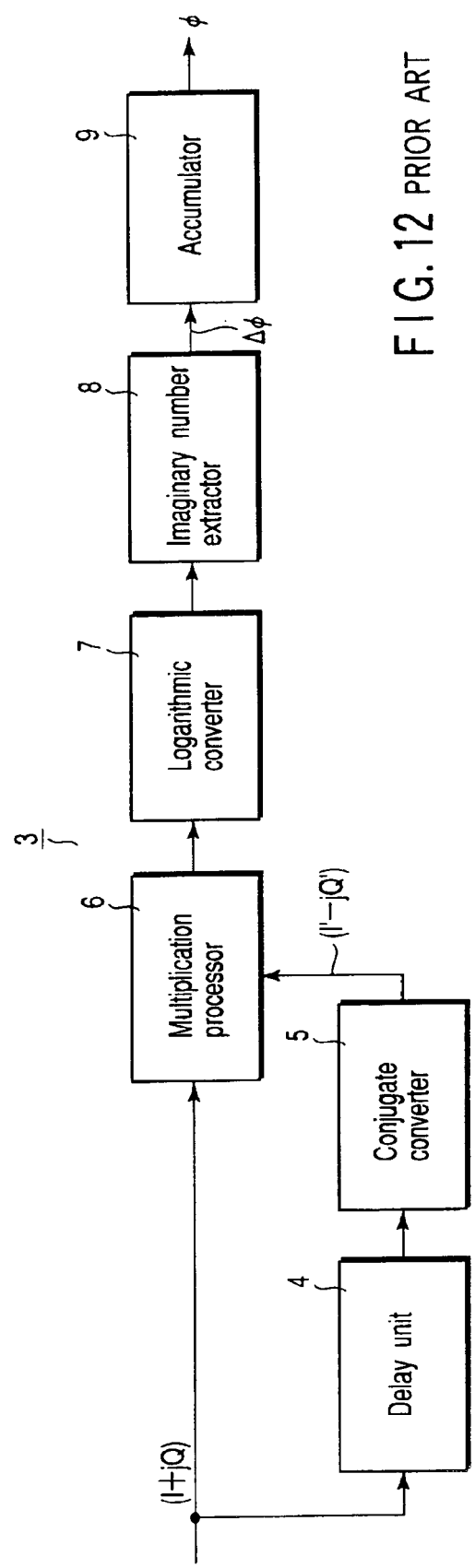
FIG. 12 is a block diagram showing a configuration of a phase detector in a prior art.

This frequency converter 41 is realized by using a mixer as shown in FIG. 7, by using a dividing circuit as shown in FIG. 8 or FIG. 9, or by using the both.

FIG. 7 is a structural example of two-mixer type frequency converter 41, in which a local oscillator circuit 42 oscillates a local oscillation signal Sc at a frequency fc different from the nominal frequency fa of the reference signal Sr and object signal to be measured Sx by tens of Hz to hundreds of kHz, and issues to mixers 43, 44.

Frequency component Sr' of difference from output component of the mixer 43 receiving the local oscillation signal Sc and reference signal Sr is extracted by a low pass filter (LPF) 45.

Similarly, frequency component Sx' of difference from output component of the mixer 44 receiving the local oscillation signal Sc and object signal to be measured Sx is extracted by an LPF 46.

As the frequency converter 41 using mixers, aside from the two-mixer type mentioned above, it is also possible to employ an image rejection type smaller in S/N drop due to an image although the structure is slightly complicated.

On the other hand, FIG. 8 shows a structural example of the frequency converter 41 using two frequency dividers, in which two frequency dividers 47, 48 are used, and the reference signal Sr and object signal to be measured Sx are divided in frequency by N, and divided signals Sr', Sx' are issued.

FIG. 9 shows an example of dividing by phase locked loop (PLL), in which a signal issued from a voltage control oscillator (VCO) 49 is multiplied by P times by a multiplier 50, the phase difference of the multiplied signal and reference signal Sr is detected by a phase comparator 51, the control signal extracted by an LPF 52 from this error signal is given to the VCO 49, and a signal Sr' locked at 1/P frequency of the reference signal Sr is issued from the VCO 49.

Further, an output signal from a VCO 53 is multiplied by P times by a multiplier 54, the phase difference of the multiplied signal and object signal to be measured Sx is detected by a phase comparator 55, the control signal extracted by an LPF 56 from this error signal is given to the VCO 53, and a signal Sx' locked at 1/P frequency of the object signal to be measured Sx is issued from the VCO 53.

Meanwhile, the entire frequency dividing ratio can be increased to N×P by using the frequency dividers 47, 48 in FIG. 8 in the front stage or rear stage of the frequency divider of PLL configuration in FIG. 9.

Further, in the front stage of the mixer type as shown in FIG. 7, the frequency dividing type in FIG. 8 or FIG. 9 or combination thereof may be provided.

However, in the signal dividing type in FIG. 8 or FIG. 9, the absolute displacement amount of phase is also compressed by the portion of frequency dividing ratio, but in the two-mixer type in FIG. 7, the absolute displacement amount of phase is not changed, and the two-mixer type in FIG. 7 is advantageous where precise measurement is needed.

The output of the two-mixer type frequency converter 41 includes phase variation component of the local oscillation signal Sc, but since this phase variation component is canceled in operation of a quadrature detector 65 described below, and there is no adverse effect on measurement.

Signals Sr', Sx' thus transformed to low frequency band in the frequency converter 41 are respectively put into a first A/D converter 60 and a second A/D converter 61.

The first A/D converter 60 and second A/D converter 61 sample the reference signal Sr' and object signal to be measured Sx' transformed into low frequency band by a common sampling signal Ss of frequency fs, convert into digital signals Dr, Dx, and send out into a first high pass filter (HPF) 62 and a second HPF 63.

The first HPF 62 removes the direct-current component contained in the output signal Dr of the first A/D converter 60, and the second HPF 63 removes the direct-current component contained in the output signal Dx of the second A/D converter 61.

As a result, it is effective to prevent occurrence of measurement error caused by direct-current offset of the frequency converter 41 and first and second A/D converters 60,61 and its fluctuations.

The first HPF 62 and second HPF 63 are of a primary CR type, and determine the average of input signals sequentially, and subtract the determined average from the input signal.

Next, the quadrature detector 65 determines the in-phase signal I showing the in-phase component and the quadrature signal Q showing the quadrature component of the signals Dr', Dx' issued from the first HPF 62 and second HPF 63.

In this quadrature detector 65, the output signal Dr' from the first HPF 62 is divided into two quadrature signal components Vr, Ur by a first 90-degree phase shifter 66, and put into an arithmetic circuit 68.

Further, the output signal Dx' from the second HPF 63 is divided into two quadrature signal components Vx, Ux by a second 90-degree phase shifter 67, and put into the arithmetic circuit 68.

With respect to these signal components, the arithmetic circuit 68 calculates as follows, and determines the in-phase signal Ik and quadrature signal Qk.

$$Ik = Vr \cdot Ur + Vx \cdot Ux$$

$$Qk = Ur \cdot Vx - Vr \cdot Ux$$

The first 90-degree phase shifter 66 and second 90-degree phase shifter 67 are composed of a half-band filter or Hilbert converter.

The in-phase signal Ik and quadrature signal Qk obtained in this manner are put into a phase detector 20' composed nearly same as the above phase detector 20.

As shown in FIG. 10, this phase detector 20' is similar to the phase detector 20, except for the structure of a displacement accumulator 27'.

The displacement accumulator 27' decimates the cumulative value $u_k$ of phase displacement obtained from the angle region number $p_k$, number of rotations $c_k$ of phase, and angle region number M, and issues the output to an evaluation calculator 80 described below.

In the evaluation calculator 80, as described below, the frequency stability is calculated, and it is hence required to decimate in order to extract only the low frequency component of the cumulative value $u_k$ of phase displacement.

In this decimating process, treble cut-off process by LPF is needed as its pretreatment.

At this time, in the method for decimating after treble cut-off process by LPF of the cumulative value $u_k$ of phase displacement issued by the displacement accumulator 27 of the phase detector 20 described above, the structure of the LPF is complicated.

In this method, the arithmetic processing for treble cut-off process must be executed on the data of bit length in the total of bit length of angle region number $p_k$ and bit length of the number of rotations $c_k$ of phase, and hence the structure of the LPF is complicated.

By contrast, in the displacement accumulator 27'of this phase detector 20', as shown in FIG. 10, first, treble cut-off process on the angle region number $p_k$ is executed by the LPF 71, and then L/1 decimating process is executed on the output from the LPF 71 in the decimating unit 72, so that an angle region number $p_k'$ is obtained.

Further, after treble cut-off process on the number of rotations $c_k$ of phase in the LPF 73, the output from the LPF 73 is decimated by L/1 in the decimating unit 74, and the number of rotations $c_k'$ of phase is obtained.

The processing result $c_k'$ and number M of angle regions are multiplied in the multiplier 28.

Then, the output from the multiplier 28 and the processing result $p_k'$ of the decimating unit 72 are summed up in the adder 29, and the phase displacement amount $u_k'$ decimated from the adder 29 is issued to the evaluation calculator 80.

That is, in the displacement accumulator 27' of the phase detector 20', the decimating process on the angle region number $p_k$ and the number of rotations $c_k$ of phase is executed separately, and the cumulative value $u_k'$ of phase displacement is calculated.

As a result, the number of input bits of the LPF can be decreased, and the individual calculation processing of the LPF is heightened in speed.

The cumulative value $u_k'$ of phase displacement detected by the phase detector 20' is put into the evaluation calculator 80, and is used for evaluation calculation for evaluation of frequency stability of the object signal to be measured Sx with respect to the reference signal Sr.

Functions used in this evaluation calculation include ADEV (Allan deviation) used in Wanda evaluation, MADED (modified Allan deviation), TDEV (time deviation), TIE (time interval error), MTIE (maximum time interval error), and others.

By calculating any one of these functions by using the cumulative value $u_k'$ detected by the phase detector 20' as variable, the frequency stability of object signal to be measured Sx with respect to the reference signal Sr can be evaluated.

For example, in the case of evaluation by ADEV, the following calculation is executed on the cumulative value $u_k'$=Xk of phase displacement.

$$ADEV(n/f)=\{\Sigma\{x[t_0+(i+2n)/f]-2x[t_0+(i+n)/f]+x(t_0+i/f)\}^2/[2n^2(N-2n)/f^2]\}^{1/2}$$

where symbol $\Sigma$ is the sum from i=1 to N−2n, N is the total number of samples, f is the sampling frequency on variable Xk, and t0 is the time initial value.

In the case of evaluation by MADEV, the calculation is as follows.

$$MADEV(n/f)=\{j\Sigma\{i\Sigma x[t_0+(i+2n)/f]-2x[t_0+(i+n)/f]+x(t_0+i/f)\}^2/[2n^4(N-3n+1)/f^2]\}^{1/2}$$

where symbol $i\Sigma$ is the sum from I=j to n+j−1, and $j\Sigma$ is the sum from j=1 to N−3n+1.

In the case of evaluation by TDEV, the calculation is as follows.

$$TDEV(n/f)=\{j\Sigma\{i\Sigma x[t_0+(i+2n)/f]-2x[t_0+(i+n)/f]+x(t_0+i/f)\}^2/[6n^\circ(N-3n+1)]\}^{1/2}$$

The result of calculation by the evaluation calculator 80 is issued to the output device such as display unit or printer not shown, and from this output, therefore, the frequency stability of object signal to be measured Sx with respect to the reference signal Sr can be evaluated.

As explained herein, the phase detector of the present invention identifies the phase determined by the in-phase signal I and quadrature signal Q entered at a certain timing with any one of a plurality M of three or more of angle regions obtained by equally dividing an angle range of 2 π, on virtual quadrature coordinates expressing the in-phase signal I and quadrature signal Q, detects the angle region number assigned in this angle region, determines the difference between the detected angle region number and the angle region number determined at its preceding timing, inspects the region number difference to find in any one of the ranges predetermined for the number M of angle regions, issues the data showing whether or not the phase is displaced beyond the bounds of the initial angle region and final angle region, and determines the cumulative value of phase displacement from the number of rotations of phase obtained by accumulating such data, the region number, and the number M of angler regions.

Accordingly, the phase detector of the present invention is smaller in the arithmetic process and higher in operation speed, as compared with the conventional phase detector designed to detect phase displacement by processing multiplication of complex number composed of two sets of in-phase signal I and quadrature signal Q entered continuously.

The frequency stability measuring apparatus of the present invention transforms the reference signal and object signal to be measured to low frequency band by a frequency converter, converts them into digital values by an A/D converter, and removes the direct-current components of the converted digital signals by the first and second HPF, detects quadrature signals by a quadrature detector, determines the in-phase signal and quadrature signal of the reference signal and object signal to be measured, determines the cumulative value of the phase displacement by the phase detector, and evaluates the cumulative value.

Accordingly, the frequency stability measuring apparatus of the present invention is free from direct-current offset of a frequency converter or an A/D converter or an error due to its fluctuation, and is hence capable of measuring at high precision in a simple configuration.

Further, the frequency stability measuring apparatus of the present invention is, when decimating as pretreatment for evaluating in the displacement accumulator, designed to execute independently the decimating process of region numbers issued by the phase region detector and the decimating process of the number of rotations of phase, and then determine the cumulative value of phase displacement, and therefore the configuration of the LPF used in decimating process can be simplified.

In the frequency stability measuring apparatus of the present invention, when using two-mixer type frequency converter as a frequency converter, phase fluctuations due to frequency fluctuations are not compressed, and the phase fluctuations of local oscillation signals are canceled to each other to have no adverse effects on measurement, so that measurement of high precision is realized.

What is claimed is:

1. A phase detector for, receiving in-phase signal I representing in-phase component and quadrature signal Q representing quadrature component of first signal and second signal, respectively, and determining a variation of phase of the second signal with respect to a phase of the first signal, comprising:

a phase region detector which equally divides an angle range of 2 π it preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the virtual quadrature coordinates, a phase rotation counter which issues the number of rotations of the phase on the virtual quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase φ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation amount of the phase exceeds a predetermined value on the virtual quadrature coordinates, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions, and wherein the out-of-bounds detector, when the number M of angle regions is an even number as the predetermined range, in the case of [M/2] being the maximum integer not exceeding M/2, issues data $s_k=1$ representing the phase is changed to exceed the bounds counterclockwise when the region number difference $\Delta p_k$ is included in the range of $-(M-1)$ to $-([M/2]+1)$, issues data $s_k=0$ representing that the phase is changed within a range not exceeding the bounds when the region number difference $\Delta p_k$ is included in the range of $-[M/2]$ to $[M/2]-1$, and issues data $s_k=1$ representing that the phase is changed so as to exceed the bounds clockwise when the region number difference $\Delta p_k$ is included in the range of $[M/2]$ to $M-1$.

2. The phase detector according to claim 1, wherein the number M of angle regions is a numerical value expressed from about 8 bits to tens of bits.

3. The phase detector according to claim 1, wherein the phase region detector detects the phase angle φ determined by the in-phase signal I and quadrature signal Q by calculating the formula:

φ=arg (I+jQ) (where arg(z) is a function representing argument of complex number z).

4. The phase detector according to claim 1, wherein the phase rotation counter accumulates the data $s_k$ issued from the out-of-bounds detector, and determines the number of times (phase rotation count) $c_k$ of the phase rotating by $2\pi$it portion.

5. The phase detector according to claim 1, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

6. A phase detector for receiving in-phase signal I representing in-phase component and quadrature signal Q representing quadrature component of first signal and second signal, respectively, and determining a variation of phase of the second signal with respect to a phase of the first signal, comprising:

a phase region detector which equally divides an angle range of $2\pi$ it preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the virtual quadrature coordinates, a phase rotation counter which issues the number of rotations of the phase on the virtual quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase φ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation amount of the phase exceeds a predetermined value on the virtual quadrature coordinates, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions, and wherein the out-of-bounds detector, when the number M of angle regions is an even number as the predetermined range, in the case of [M/2] being the maximum integer not exceeding M/2, issues data $s_k=1$ representing the phase is changed to exceed the bounds counterclockwise when the region number difference $\Delta p_k$ is included in the range of $-(M-1)$ to $-[M/2]$, issues data $s_k=0$ representing that the phase is changed within a range not exceeding the bounds when the region number difference $\Delta p_k$ is included in the range of $-([M/2]-1)$ to $[M/2]$, and issues data $s_k=-1$ representing that the phase is changed so as to exceed the bounds clockwise when the region number difference $\Delta p_k$ is included in the range of $[M/2]+1$ to $M-1$.

7. The phase detector according to claim 6, wherein the number M of angle regions is a numerical value expressed from about 8 bits to tens of bits.

8. The phase detector according to claim 6, wherein the phase region detector detects the phase angle $\phi$ determined by the in-phase signal I and quadrature signal Q by calculating the formula:

$\phi = \arg(I+jQ)$ (where $\arg(z)$ is a function representing argument of complex number z).

9. The phase detector according to claim 6, wherein the phase rotation counter accumulates the data $s_k$ issued from the out-of-bounds detector, and determines the number of times (phase rotation count) $c_k$ of the phase rotating by $2\pi$ portion.

10. The phase detector according to claim 6, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

11. A phase detector for receiving in-phase signal I representing in-phase component and quadrature signal Q representing quadrature component of first signal and second signal, respectively, and determining a variation of phase of the second signal with respect to a phase of the first signal, comprising:

a phase region detector which equally divides an angle range of $2\pi$ preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the virtual quadrature coordinates, a phase rotation counter which issues the number of rotations of the phase on the virtual quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase $\phi$ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation amount of the phase exceeds a predetermined value on the virtual quadrature coordinates, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions, and wherein the out-of-bounds detector, when the number M of angle regions is an odd number as the predetermined range, in the case of [M/2] being the maximum integer not exceeding M/2, issues data $s_k=1$ representing the phase is changed to exceed the bounds counterclock wise when the region number difference $\Delta p_k$ is included in the range of $-(M-1)$ to $-([M/2]+1)$, issues data $s_k=0$ representing that the phase is changed within a range not exceeding the bounds when the region number difference $\Delta p_k$ is included in the range of $-[M/2]$ to $[M/2]$, and issues data $s_k=-1$ representing that the phase is changed so as to exceed the bounds clockwise when the region number difference $\Delta p_k$ included in the range of $[M/2]+1$ to $M-1$.

12. The phase detector according to claim 4, wherein the number M of angle regions is a numerical value expressed from about 8 bits to tens of bits.

13. The phase detector according to claim 11, wherein the phase region detector detects the phase angle φ determined by the in-phase signal I and quadrature signal Q by calculating the formula:

φ=arg (I+jQ) (where arg(z) is a function representing argument of complex number z).

14. The phase detector according to claim 11, wherein the phase rotation counter accumulates the data $s_k$ issued from the out-of-bounds detector, and determines the number of times (phase rotation count) $c_k$ of the phase rotating by 2 π portion.

15. The phase detector according to claim 11, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

16. A frequency stability measuring apparatus comprising:

a frequency converter for converting a reference signal and an object signal to be measured equal in nominal frequency into a band below a specified frequency, first and second A/D converters for converting the reference signal and object signal to be measured are transformed by the frequency converter into digital values by sampling by a common sampling signal, first and second high pass filters for removing direct-current components of output signals from the first and second A/D converters, a quadrature detector for detecting an in-phase signal representing its in-phase component and a quadrature signal representing its quadrature component, by detecting quadrature components of output signals from the first and second high pass filters, a phase detector for detecting the variation of phase determined by the in-phase signal and quadrature signal issued from the quadrature detector, and an evaluation calculator for calculating to evaluate a relative frequency stability of object signal to be measured with respect to reference signal by using the phase variation detected by the phase detector, wherein the phase detector is a phase detector for receiving in-phase signal I representing in-phase component and quadrature signal Q representing quadrature component of first signal and second signal respectively, and determining the variation of phase of the second signal with respect to the phase of the first signal, comprising:

a phase region detector which equally divides an angle range of 2 π preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the quadrature coordinates, a phase rotation counter which issues the number of rotations of the phase on the quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase φ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation of the phase exceeds a predetermined value on the virtual quadrature coordinates, wherein the out-of-bounds detector, when the number M of angle regions is an even number as the predetermined range, in the case of [M/2] being the maximum integer not exceeding M/2, issues data $s_k=1$ representing the phase is changed to exceed the bounds counterclockwise when the region number difference $\Delta p_k$ is included in the range of −(M−1) to −([M/2]+1), issues data $s_k=0$ representing that the phase is changed within a range not exceeding the bounds when the region number difference $\Delta p_k$ is included in the range of −[M/2] to [M/2]−1, and issues data $s_k=-1$ representing that the phase is changed so as to exceed the bounds clockwise when the region number difference $\Delta p_k$ is included in the range of [M/2] to M−1.

17. The frequency stability measuring apparatus according to claim 16, wherein the frequency converter is composed by using at least one of a mixer and frequency dividing circuit.

18. The frequency stability measuring apparatus according to claim 16, wherein the first and second high pass filters are of primary CR type for processing individually by finding the average of input signals sequentially, and subtracting the obtained average from the input signal.

19. The frequency stability measuring apparatus according to claim 16, wherein the quadrature detector divides output signals Dx', Dr' issued from the first and second high pass filters into two quadrature signal components Vx, Ux and Vr, Ur respectively by first and second 90-degree phase shifters, and issues into an arithmetic circuit, and this arithmetic circuit calculates these signal components Vx, Ux and Vr, Ur in the formula $$Ik = Vr \cdot Ur + Vx \cdot Ux$$
$$Qk = Ur \cdot Vx - Vr \cdot Ux$$

and determines the in-phase signal Ik and quadrature signal Qk.

20. The frequency stability measuring apparatus according to claim 16, wherein the number M of angle regions is a numerical value expressed from about 8 bits to tens of bits.

21. The frequency stability measuring apparatus according to claim 16, wherein the phase region detector detects the phase angle φ determined by the in-phase signal I and quadrature signal Q by calculating the formula:

φ=arg (I+jQ) (where arg(z) is a function representing argument of complex number z).

22. The frequency stability measuring apparatus according to claim 16, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions.

23. The frequency stability measuring apparatus according to claim 16, wherein the phase rotation counter accumulates the data $s_k$ issued from the out of bounds detector, and determines the number of times (phase rotation count) $c_k$ of the phase rotating by 2 π portion.

24. The frequency stability measuring apparatus according to claim 16, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

25. The frequency stability measuring apparatus according to claim 16, wherein the displacement accumulator is composed of first and second low pass filters for treble cut-off process of the angle region number $p_k$ and number of rotations $c_k$ of phase, first and second decimating units for decimating by L/1 the outputs from the first and second low pass filters, a multiplier for multiplying the processing result $c_k'$ in the second decimating unit and the number M of angle regions, and an adder for summing up the output from the multiplier and the processing result $p_k'$ in the first decimating unit, and thereby the decimated phase displacement $u_k'$ is issued from the adder into the evaluation calculator.

26. A frequency stability measuring apparatus comprising:

a frequency converter for converting a reference signal and an object signal to be measured equal in nominal frequency into a band below a specified frequency, first and second A/D converters for converting the reference signal and object signal to be measured are transformed by the frequency converter into digital values by sampling by a common sampling signal, first and second high pass filters for removing direct-current components of output signals from the first and second AID converters, a quadrature detector for detecting an in-phase signal representing its in-phase component and a quadrature signal representing its quadrature component, by detecting quadrature components of output signals from the first and second high pass filters, a phase detector for detecting the variation of phase determined by the in-phase signal and quadrature signal issued from the quadrature detector, and an evaluation calculator for calculating to evaluate a relative frequency stability of object signal to be measured with respect to reference signal by using the phase variation detected by the phase detector, wherein the phase detector is a phase detector for receiving in-phase signal I representing in-phase component and quadrature signal Q representing quadrature component of first signal and second signal respectively, and determining the variation of phase of the second signal with respect to the phase of the first signal, comprising:

a phase region detector which equally divides an angle range of 2 π preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the quadrature coordinates, a phase rotation counter which issues the number of rotations of the phase on the quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase φ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation of the phase exceeds a predetermined value on the virtual quadrature coordinates, and wherein the out-of-bounds detector, when the number M of angle regions is an even number as the predetermined range, in the case of [M/2] being the maximum integer not exceeding M/2, issues data $s_k=1$ representing the phase is changed to exceed the bounds counterclockwise when the region number difference $\Delta p_k$ is included in the range of $-(M-1)$ to $-[M/2]$, issues data $s_k=0$ representing that the phase is changed within a range not exceeding the bounds when the region number difference $\Delta p_k$ is included in the range of $-([M/2]-1)$ to $[M/2]$, and issues data $s_k=1$ representing that the phase is changed so as to exceed the bounds clockwise when the region number difference $\Delta p_k$ is included in the range of $[M/2]+1$ to $M-1$.

27. The frequency stability measuring apparatus according to claim 26, wherein the frequency converter is composed by using at least one of a mixer and frequency dividing circuit.

28. The frequency stability measuring apparatus according to claim 26, wherein the first and second high pass filters are of primary CR type for processing individually by finding the average of input signals sequentially, and subtracting the obtained average from the input signal.

29. The frequency stability measuring apparatus according to claim 26, wherein the quadrature detector divides output signals Dx', Dr' issued from the first and second high pass filters into two quadrature signal components Vx, Ux and Vr, Ur respectively by first and second 90-degree phase shifters, and issues into an arithmetic circuit, and this arithmetic circuit calculates these signal components Vx, Ux and Vr, Or in the formula $Ik=Vr\cdot Ur+Vx\cdot Ux$ $Qk=Ur\cdot Vx-Vr\cdot Ux$ and determines the in-phase signal Ik and quadrature signal Qk.

30. The frequency stability measuring apparatus according to claim 26, wherein the number M of angle regions is a numerical value expressed from about 8 bits to tens of bits.

31. The frequency stability measuring apparatus according to claim 26, wherein the phase region detector detects the phase angle φ determined by the in-phase signal I and quadrature signal Q by calculating the formula:

φ=arg (I+jQ) (where arg(z) is a function representing argument of complex number z).

32. The frequency stability measuring apparatus according to claim 26, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions.

33. The frequency stability measuring apparatus according to claim 26, wherein the phase rotation counter accumulates the data $s_k$ issued from the out of bounds detector, and determines the number of times (phase rotation count) $c_k$ of the phase rotating by $2\pi$ portion.

34. The frequency stability measuring apparatus according to claim 26, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

35. The frequency stability measuring apparatus according to claim 26, the displacement accumulator is composed of first and second low pass filters for treble cut-off process of the angle region number $p_k$ and number of rotations $c_k$ of phase, first and second decimating units for decimating by L/1 the outputs from the first and second low pass filters, a multiplier for multiplying the processing result $c_k'$ in the second decimating unit and the number M of angle regions, and an adder for summing up the output from the multiplier and the processing result $p_k'$ in the first decimating unit, and thereby the decimated phase displacement $u_k'$ is issued from the adder into the evaluation calculator.

36. A frequency stability measuring apparatus comprising:

a frequency converter for converting a reference signal and an object signal to be measured equal in nominal frequency into a band below a specified frequency, first and second A/D converters for converting the reference signal and object signal to be measured are transformed by the frequency converter into digital values by sampling by a common sampling signal, first and second high pass filters for removing direct-current components of output signals from the first and second A/D converters, a quadrature detector for detecting an in-phase signal representing its in-phase component and a quadrature signal representing its quadrature component, by detecting quadrature components of output signals from the first and second high pass filters, a phase detector for detecting the variation of phase determined by the in-phase signal and quadrature signal issued from the quadrature detector, and an evaluation calculator for calculating to evaluate a relative frequency stability of object signal to be measured with respect to reference signal by using the phase variation detected by the phase detector, wherein the phase detector is a phase detector for receiving in-phase signal I representing in-phase component and quadrature signal Q representing quadrature component of first signal and second signal respectively, and determining the variation of phase of the second signal with respect to the phase of the first signal, comprising:

a phase region detector which equally divides an angle range of $2\pi$ preliminarily, on virtual quadrature coordinates expressing the in-phase signal I and quadrature signal Q, into a plurality M of three or more angle regions, sequentially assigns angle region numbers in each of the angle regions, detects the angle region corresponding to the variation of phase of the second signal starting from the phase of the first signal, and issues the angle region number assigned in the detected angle region, a phase displacement detector which issues a signal expressing the time change of the variation of the phase from the change corresponding to the time of the angle region number issued from the phase region detector, an out-of-bounds detector which receives a signal issued from the phase displacement detector, and issues an out-of-bounds signal including the out-of-bounds direction every time the variation amount of the phase exceeds a predetermined value on the quadrature coordinates, a phase rotation counter which issues the number of rotations of the phase on the quadrature coordinates by accumulating the out-of-bounds signals issued from the out-of-bounds detector, and a displacement accumulator which determines the cumulative value of phase displacement determined by the in-phase signal I and quadrature signal Q, based on the angle region number issued by the phase region detector, the number of angle regions, and the number of rotations of the phase issued by the phase rotation counter, wherein the phase region detector detects the angle region including the phase φ determined by the in-phase signal I and quadrature signal Q entered on the virtual quadrature coordinates, at every input timing of the in-phase signal I and quadrature signal Q, and issues angle region number $p_k$ assigned in the detected angle region, wherein the phase region detector is composed of a delay unit for delaying angle region number $p_k$ issued from the phase region detector at a certain timing by one sample clock each, and a subtractor for determining region number difference $\Delta p_k$ by subtracting angle region number $p_{(k-1)}$ issued from the delay unit being issued from the phase region detector at the preceding timing, from the angle region number $p_k$ issued from the phase region detector, wherein the out-of-bounds detector receives a signal issued from the phase displacement detector, and issues an out-of-bounds signal including the out-of-bounds direction every time the variation of the phase exceeds a predetermined value on the virtual quadrature coordinates, and wherein the out-of-bounds detector, when the number M of angle regions is an odd number as the predetermined range, in the case of [M/2] being the maximum integer not exceeding M/2, issues data $s_k$=1 representing the phase is changed to exceed the bounds counterclock wise when the region number difference $\Delta p_k$ is included in the range of −(M−1) to −([M/2]+1), issues data $s_k$=0 representing that the phase is changed within a range not exceeding the bounds when the region number difference $\Delta p_k$ is included in the range of −[M/2] to [M/2], and issues data $s_k$=−1 representing that the phase is changed so as to exceed the bounds clockwise when the region number difference $\Delta p_k$ is included in the range of [M/2]+1 to M−1.

37. The frequency stability measuring apparatus according to claim 36, wherein the frequency converter is composed by using at least one of a mixer and frequency dividing circuit.

38. The frequency stability measuring apparatus according to claim 36, wherein the first and second high pass filters are of primary CR type for processing individually by finding the average of input signals sequentially, and subtracting the obtained average from the input signal.

39. The frequency stability measuring apparatus according to claim 36, wherein the quadrature detector divides output signals Dx', Dr' issued from the first and second high pass filters into two quadrature signal components Vx, Ux and Vr, Ur respectively by first and second 90-degree phase shifters, and issues into an arithmetic circuit, and this arithmetic circuit calculates these signal components Vx, Ux and Vr, Or in the formula $$Ik=Vr \cdot Ur+Vx \cdot Ux$$

$$Qk=Ur \cdot Vx-Vr \cdot Ux$$

and determines the in-phase signal Ik and quadrature signal Qk.

40. The frequency stability measuring apparatus according to claim 36, wherein the number M of angle regions is a numerical value expressed from about 8 bits to tens of bits.

41. The frequency stability measuring apparatus according to claim 36, wherein the phase region detector detects the phase angle φ determined by the in-phase signal I and quadrature signal Q by calculating the formula:

φ=arg (I+jQ) (where arg(z) is a function representing argument of complex number z).

42. The frequency stability measuring apparatus according to claim 36, wherein the out-of-bounds detector identifies the region number difference issued from the phase displacement detector with any one of the ranges predetermined for the number M of angle regions, and issues data $s_k$ representing whether or not the phase has been displaced to exceed the bounds of the angle region corresponding to the initial value and the angle region corresponding to the final value of the angle region numbers assigned in said plurality of angle regions.

43. The frequency stability measuring apparatus according to claim 36, wherein the phase rotation counter accumulates the data $s_k$ issued from the out of bounds detector, and determines the number of times (phase rotation count) $c_k$ of the phase rotating by 2 π portion.

44. The frequency stability measuring apparatus according to claim 36, wherein the displacement accumulator includes a multiplier and an adder, and it multiplies the phase rotation count $c_k$ issued from the phase rotation counter and the number M of angle regions by the multiplier, and sums up the result of multiplication and the angle region number $p_k$ issued from the phase region detector by the adder, and determines the cumulative value $u_k$ of the phase displacement determined by the in-phase signal I and quadrature signal Q.

45. The frequency stability measuring apparatus according to claim 36, wherein the displacement accumulator is composed of first and second low pass filters for treble cut-off process of the angle region number $p_k$ and number of rotations $c_k$ of phase, first and second decimating units for decimating by L/1 the outputs from the first and second low pass filters, a multiplier for multiplying the processing result $c_k'$ in the second decimating unit and the number M of angle regions, and an adder for summing up the output from the multiplier and the processing result $p_k'$ in the first decimating unit, and thereby the decimated phase displacement $u_k'$ is issued from the adder into the evaluation calculator.

* * * * *